United States Patent [19]

Yamagata

[11] Patent Number: 5,190,613
[45] Date of Patent: Mar. 2, 1993
:::

[54] METHOD FOR FORMING CRYSTALS

[75] Inventor: Kenji Yamagata, Kawasaki, Japan

[73] Assignee: Canon Kabushiki Kaisha, Tokyo, Japan

[21] Appl. No.: 778,756

[22] Filed: Oct. 18, 1991

Related U.S. Application Data

[63] Continuation of Ser. No. 415,960, Oct. 2, 1989, abandoned.

[30] Foreign Application Priority Data

Oct. 2, 1988 [JP] Japan ................... 63-247815
Sep. 29, 1989 [JP] Japan ................... 1-255524

[51] Int. Cl.⁵ ........................................... C30B 17/00
[52] U.S. Cl. ..................... 156/600; 156/603; 156/610; 156/612; 156/613; 156/614; 156/DIG. 64; 156/DIG. 73
[58] Field of Search ............... 156/600, 603, 610, 612, 156/613, 614, DIG. 64, DIG. 73

[56] References Cited

U.S. PATENT DOCUMENTS

| | | | |
|---|---|---|---|
| 3,585,088 | 6/1971 | Schwätle et al. | 156/603 |
| 3,620,833 | 11/1971 | Gleim | 156/614 |
| 3,634,143 | 11/1972 | Brenen | 156/603 |
| 3,655,439 | 4/1972 | Seiter | 156/603 |
| 4,147,584 | 4/1979 | Garrison et al. | 156/603 |
| 4,361,600 | 11/1982 | Brown | 156/603 |
| 4,448,632 | 5/1984 | Akasaka | 156/603 |
| 4,657,603 | 4/1987 | Kruehler et al. | 156/603 |

FOREIGN PATENT DOCUMENTS 0244081 11/1987 European Pat. Off. .
0306153 3/1989 European Pat. Off. .
58-69798 4/1983 Japan .
59-69495 4/1984 Japan .

OTHER PUBLICATIONS

"Epitaxial Growth" Matthews; Academic Press; New York (1975) pp. 12, 21, 415 and 428.
Brice, "Crystal Growth Process," Wiley & Sons, Blackie, Bishop Brigg, Glagon, 1986 pp. 249.
Smith et al., "Graphnepitaxy and Zone Melting Recrystallization of Pututnted Films," Journal of Crystal Growth, vol. 63 (1983) pp. 535–537.
Amano, "Low-Defect Density Silicon on Sapphire", J. of Crystal Growth, vol. 56 (1982), pp. 296–303.

Primary Examiner—Olik Chaudhuri
Assistant Examiner—Felisa Garrett
Attorney, Agent, or Firm—Fitzpatrick, Cella, Harper & Scinto

[57] ABSTRACT

A method for forming a crystal, which comprises applying, on a substrate having a primary seed comprising a non-single crystaline material having a surface area fine enough to be agglomeratable into a single single-crystalline body by heat treatment and a non-nucleation surface with smaller nucleation density than said primary seed, a heat treatment for agglomerating said primary seed to form a single crystalline seed in an atmosphere containing hydrogen gas at a temperature lower than the temperature at which said primary seed is melted, and applying a crystal growth treatment, thereby permitting a single crystal to grow with said seed as the origination point.

10 Claims, 9 Drawing Sheets

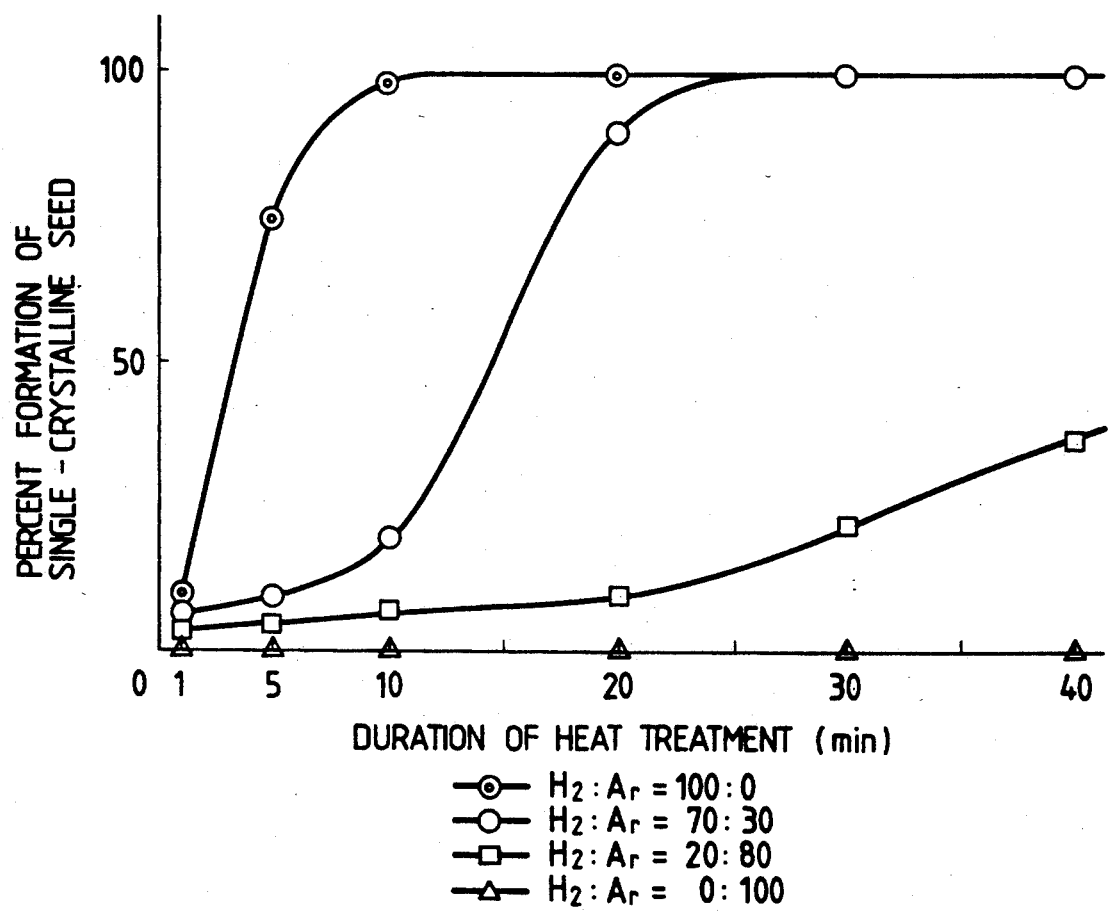

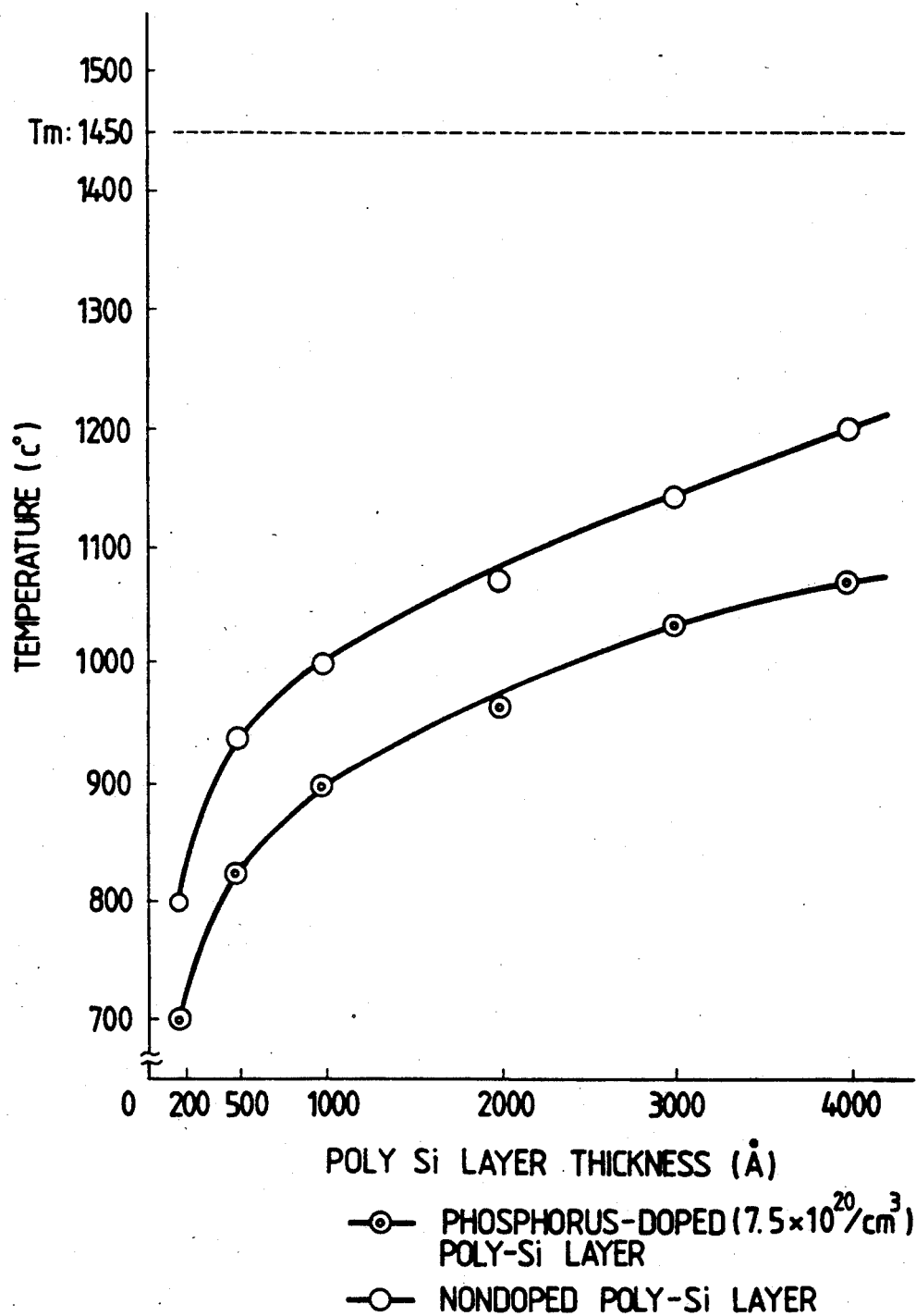

METHOD FOR FORMING CRYSTALS

This application is a continuation of application Ser. No. 07/415,960 filed Oct. 2, 1989, now abandoned.

BACKGROUND OF THE INVENTION

1. Field of the Invention

This invention relates to a method for forming a crystal which is used for forming, for example, electronic elements such as semiconductor integrated circuit, optical integrated circuit, magnetic circuit, etc., optical elements, magnetic elements, piezoelectric elements, or surface acoustic elements, etc.

2. Related Background Art

In the prior art, thin films comprising single crystals to be used for preparation of electronic elements or optical elements, etc. constituted of semiconductors and insulating materials have been formed by epitaxial growth on single crystalline substrates. For example, on a Si single crystal (silicon wafer), Si, Ge, GaAs, etc. have been known to be epitaxially grown from liquid phase, gas phase or solid phase, and also on a GaAs single crystal substrate, a single crystal such as GaAs, GaAlAs, etc. has been known to be epitaxially grown. By use of the single crystalline semiconductor thin film thus formed, semiconductor elements and integrated circuits, electroluminescent elements such as semiconductor laser, LED, etc. are prepared.

Also, recently, researches and developments of ultrahigh speed transistors by use of two-dimensional electronic gas, ultra-lattice elements utilizing quantum well, etc. have been extensively performed, and these were rendered possible by high precision epitaxial technique such as MBE (molecular beam epitaxy) by use of ultrahigh vacuum, MOCVD (metalloorganic chemical vapor deposition), etc.

However, in such epitaxial growth on a single crystal substrate, it is necessary to match the lattice constant and the thermal expansion coefficient between the single crystal material of the substrate and the epitaxial growth layer. If this matching is insufficient, crystal defects such as lattice defect, etc. will develop in the epitaxial layer. Also, the elements constituting the substrate may be diffused into the epitaxial layer.

Thus, it can be understood that the method of forming a thin film single crystal according to epitaxial growth depends greatly on its substrate material. Mathews et al have examined combinations of the substrate material and the epitaxial growth layer (EPITAXIAL GROWTH, Academic Press, New York, 1975, ed. by J. W. Mathews).

The size of a single crystal substrate is presently about 6 inches for Si wafer, and enlargement of GaAs and sapphire substrate has been further delayed. In addition, since a single crystal substrate is high in production cost, the cost per chip inevitably becomes higher.

Thus, for permitting a single crystal of good quality which can be prepared according to the method of the prior art, there has been the problem that the kind of the substrate material is limited to a very narrow scope, and the degree of freedom during design and preparation is small.

On the other hand, researches and developments for three-dimensional integrated circuits which accomplish high integration and multi-function by laminating semiconductor elements in the normal direction of the substrate have been extensively done in recent years. Researches and developments for enlarged area semiconductor devices such as solar battery, switching transistor of liquid crystal display device, etc. in which elements are arranged in an array on an inexpensive glass are also becoming increasingly popular year by year.

What is common to both of these is formation of a thin film single crystal on an amorphous insulating material, and a technique for forming an electronic element such as a transistor, thereon is required there. Particularly a technique for forming a single crystal semiconductor of high quality on an amorphous insulating material has been desired.

Generally speaking, when a thin film is deposited on an amorphous insulating material substrate such as $SiO_2$, due to deficiency of long distance order of the substrate material, the crystalline structure of the deposited film will not become single crystal, but become amorphous or polycrystalline. Accordingly, the amorphous film is a film under the state, wherein although the short distance order of the nearest atom is preserved, there is no long distance order, and the polycrystalline film is a film in which single crystals having no specific crystal direction are aggregated as separate crystals with grain boundaries.

For example, when Si is formed by the hot CVD method on amorphous $SiO_2$, if the deposition temperature is about 580° C. or lower, it becomes amorphous silicon, whereas it becomes polycrystalline silicon with grain sizes ranging between hundreds to thousands A at a high temperature. However, the grain sizes of polycrystalline silicon and the distribution thereof will vary greatly depending on the formation method.

Further, in the method of forming a polycrystalline thin film of large grain size, by melting and solidifying an amorphous film or a polycrystalline film with thermal energy by use of a laser, a rod-shaped heater, etc., a polycrystalline film with a large grain size of about micron or millimeter is obtained (Single Crystal silicon on non-single-crystal insulators, Journal of Crystal Groth vol. 63, No. 3, October, 1983, edited by G. W. Cullen).

Referring now to an example in which an electron element such as transistor, is formed on the thin film of each crystal structure thus formed, electron mobility is measured from it characteristics and compared with the electron mobility when using a polycrystalline silicon. The electron mobility in the polycrystalline silicon having a grain size of several $\mu m$ to several mm formed by melting and solidification is about the same as that in the case of single crystalline silicon, the electron mobility in the polycrystalline silicon having a grain size distribution of some hundreds to some thousands A is about $10^{-3}$ of that of single crystal silicon, and an electron mobility of about $2 \times 10^{-4}$ of that of single crystal silicon is obtained in amorphous silicon.

From these results, it can be understood that there is a great difference in electrical characteristics between the element formed within the single crystal region and the element formed as bridging across the grain boundary. Thus, the deposited film on amorphous surface obtained in the prior art method becomes a non-single-crystalline structure such as amorphous structure or a polycrystal, having grain size distribution, and the element prepared thereon is greatly inferior in its performance as compared with the element prepared in a single crystal. Accordingly, the uses are now still limited to simple switching elements, solar batteries, photoelectric converting elements, etc.

Also, the method for forming a polycrystalline thin film with a large rain size by melting and solidification as described above requires scanning of an energy beam on an amorphous or polycrystalline thin film for each wafer, and therefore requires an enormous time for making the grain size larger resulting in poor bulk productivity. Thus there arise the problems of diffusion of the impurity by the heat applied for melting and insuitability for enlargement of area.

As described above, according to the crystal formation method of the prior art, three-dimensional integration or enlargement of area could not be done with ease, practical application to a device has been difficult, and a single crystal required for preparation of a device having excellent characteristics could not be formed easily and at low cost.

For solving this problem, the present Applicant has proposed a crystal growth method (European Laid-open Patent Publication 0:224,081, published on Nov. 4, 1987) and a crystal growth method utilizing agglomeration by heat treatment (European Laid-open Patent Publication 0,306,153 published on Mar. 8, 1989), etc.

SUMMARY OF THE INVENTION

An object of the present invention is to solve the above problems of the prior art and provide a method for forming a crystal having excellent characteristics for three-dimensional integration, enlargement of area and preparation of device.

Another object of the present invention is to provide a method for forming a crystal which has been further developed from the crystal growth method proposed by the present Applicant as described above.

Still another object of the present invention is to provide a method for forming a crystal, in which any desired substrate having heat resistance to the process temperature of the post-steps or higher can be used, degree of freedom during design and preparation is great, and a single crystal thin film can be formed with ease even on an amorphous substrate which can be enlarged in area with ease.

Still another object of the present invention is to provide a method for forming a crystal, in which the size of the single crystal and the position of the grain boundary can be controlled based on the interval of fine single crystal seeds. Single crystals grow from the respective seeds as the origination points until they collide against each other. Crystal formation treatment is performed after forming fine single crystal seeds at any desired positions on the substrate at desired intervals.

Still another object of the present invention is to provide a method for forming a crystal which can form a large number of semiconductor single crystals large enough to enable formation of a single device on an amorphous insulating substrate, for example, which can form by integration single crystal devices of high performance on an inexpensive and large area substrate such as quartz glass.

Still another object of the present invention is to provide a method, which comprises applying heat treatment on a substrate having a non-nucleation surface ($S_{NDS}$) with small nucleation density and provided with a primary seed having a sufficiently fine surface area for being agglomerated by heat treatment, in hydrogen atmosphere at a heat treatment temperature lower than the temperature at which the above primary seed melts, thereby causing agglomeration of the above primary seed to occur and form the above primary seed into a single crystal seed, and subsequently growing a single crystal by application of crystal formation treatment with the above seed as the origination point.

"Agglomeration" as herein used means the phenomenon that atoms move in solid phase in order to reduce the surface energy. As in the present invention, when the source for giving a seed of crystal is a thin film, the ratio of the surface area relative to the volume of the thin film is remarkably large, and consequently "agglomeration" will occur with reduction in surface energy as the driving force, even at a temperature lower than the melting point, in some cases at a temperature by far lower than the melting point.

BRIEF DESCRIPTION OF THE DRAWINGS

FIG. 7 is a graph showing the relationship between the formation percentage of the single crystalline seed and the heat treatment time.

FIG. 8 is a graph showing the relationship between the layer thickness and the agglomeration initiation temperature.

DESCRIPTION OF THE PREFERRED EMBODIMENTS

FIG. 1 shows schematically the steps of an example of a preferred embodiment of the method for forming a crystal of the present invention.

Figure 1A:
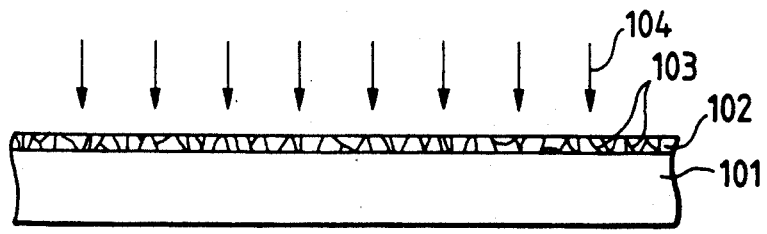
FIG. 1A to FIG. 1F are schematic illustrations for explanation of the steps of the present invention.

FIG. 1A shows a thin film 102 which becomes the seed forming source on the surface of a base material 101 having a surface with low nucleation density. As shown schematically by the arrowhead 104, an impurity may be contained in said thin film 102 in the step of doping an impurity (e.g. ion implantation, etc.), or alternatively a thin film 102 containing an impurity may be formed in an atmosphere containing a gas for doping.

Here, preferable examples of the base material having a surface with low nucleation density may include silicon wafer having the surface thermally oxidized, metallic material having amorphous silicon oxide film or amorphous silicon nitride film on the surface, ceramic material such as $Al_2O_3$, etc.

Here, the difference in nucleation density between the above base material 101 and the above thin film 102 should be preferably $10^2$-fold or more, more preferably $10^3$-fold or more.

As the material for forming a thin film 102 which becomes the seed forming source, there may be included readily agglomeratable substances having high nucleation density. For example, semiconductor materials such as Si, Ge, Sn, etc., compound semiconductor materials such as GaAs, etc., semiconductive mixed materials such as Si-Ge, Si-Sn, etc., metal materials such as Au, Ag, Cu, Pt, Pd, etc., and alloy materials such as Pt-Si, InSn, etc.

The impurity to be doped in the thin film 102 may be suitably selected as desired depending on the material for forming the thin film 102, but when a Si type material is selected for the material for forming the thin film 102, P, B, As, Sn, etc. may be included. Of course, these impurities can be used even when other materials for forming the thin film 102 may be selected.

The content of the impurity to be doped in the material for forming the thin film 102 may be preferably $1\times10^{20}$ atoms/cm$^3$ or more, preferably $5\times10^{20}$ atoms/cm$^3$ or more, optimally the solid solution limit or more, for lowering the agglomeration initiation temperature to effect agglomeration into a single body within a short time, thereby forming a single crystalline seed.

Figure 1B:
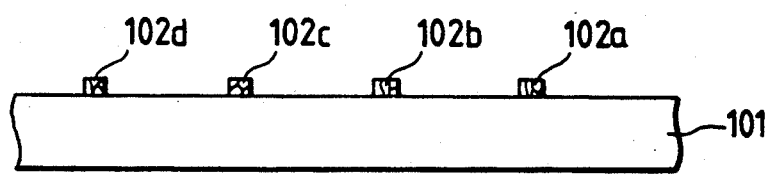
Figure 2:
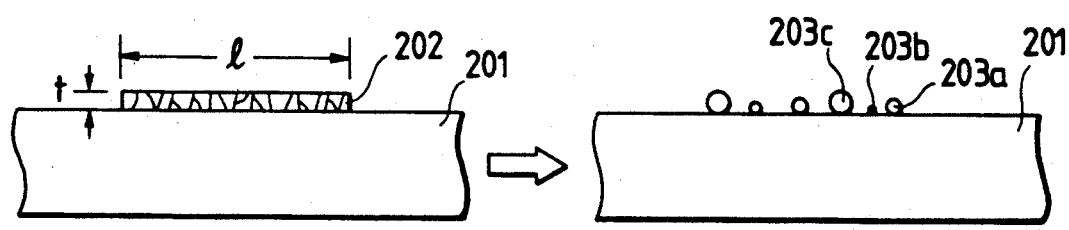
FIG. 2 to FIG. 4 are each schematic illustration for explanation of agglomeration phenomenon.
Figure 3:
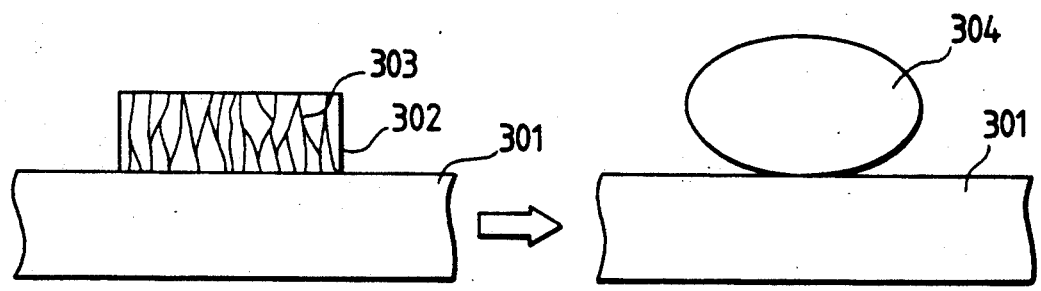
Figure 4:
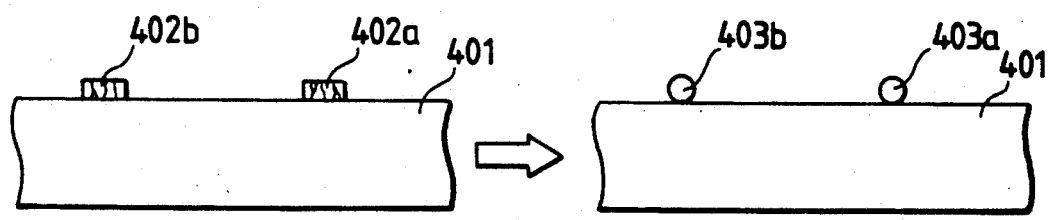

FIG. 1B shows the state having primary seeds 102a–102d formed by sufficiently fine patterning of the thin film 102 for agglomeration into single crystals without separation. Here, the sizes of the primary seeds 102a–102d which are agglomerated into single crystals are determined appropriately according to the correlation between the film thickness of the primary seeds and the size of the pattern. For example, support that the thin film 202 is patterned to a size with a thickness of t and a size of one side of l. When such t and l are not adequately selected, if heat treatment is applied on the thin film 202, the thin film 202 undergoes agglomeration phenomenon as shown on the right side of FIG. 2, but it is separated into small particles as shown by 203a–203c without forming a single body. This phenomenon occurs when t is too small relative to the patterning dimension l. Accordingly, if the film thickness t is made sufficiently large relative to the length l of one side shown in FIG. 2 as shown in FIG. 3, agglomeration can be effected to a single crystalline grain 304 without separation as shown in FIG. 3. 303 shows a grain boundary. Alternatively, when l is made sufficiently smaller relative to t shown inn FIG. 4, 402a and 402b are respectively agglomerated into single grains 403a and 403b.

Figure 5:
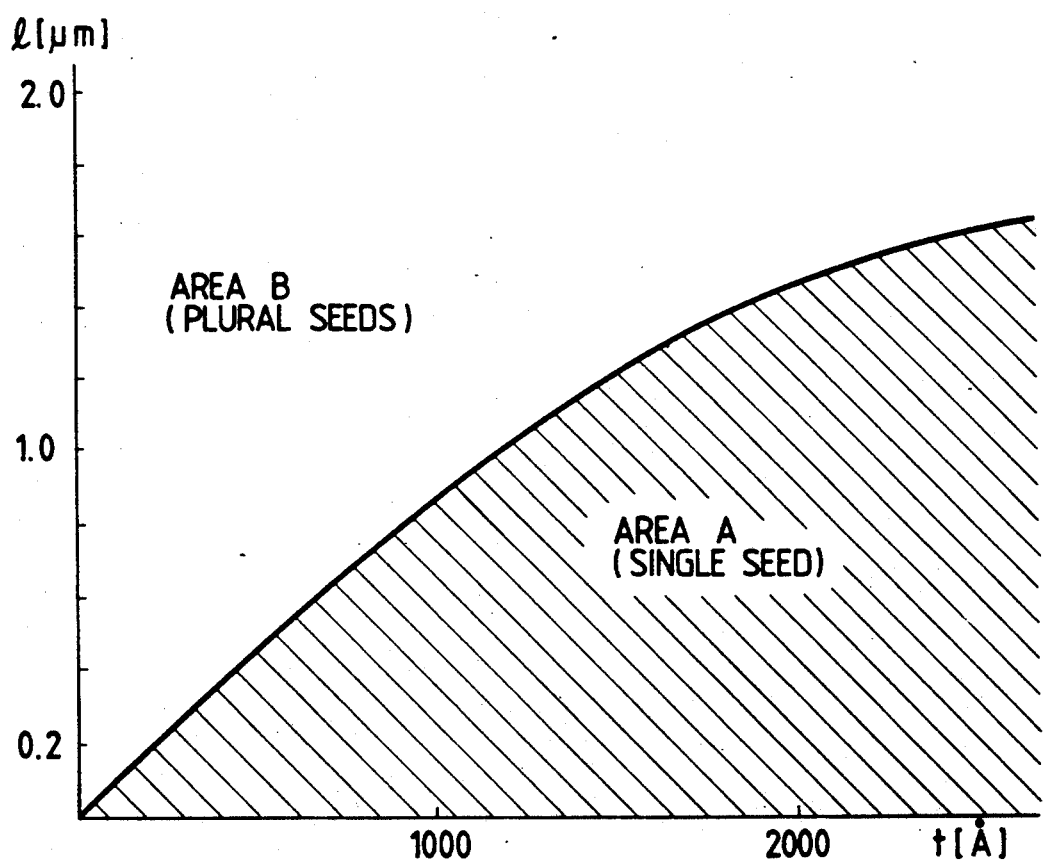
FIG. 5 is a graph showing the relationship between the film thickness and the patterning dimension as to whether the primary seed can become a single seed in the case that the primary seed is a Si thin film.
Figure 6:
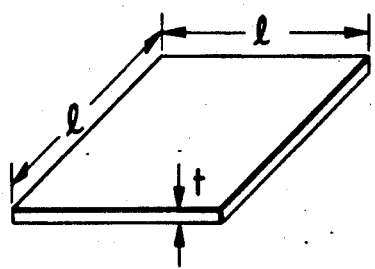
FIG. 6 is a perspective view showing the dimensions of the primary seed.

From the results of a large number of experiments and investigations made by the present inventors, in order that a primary seed having a size of one side of l and a thickness of t (see FIG. 6) is agglomerated into a single crystal, the conditions of t and l were found to have the relationship as shown in FIG. 5, when the primary seed material is a non-single crystalline silicon, namely a polycrystalline silicon or an amorphous silicon. In FIG. 5, the primary seed having dimensions in the dashed area (area A) can be agglomerated into a single seed after the heat treatment to become the seed of the crystal growth method of the present invention. However, the upper limit of the film thickness t which can become the single seed was about 1 μm (10,000 A.

Here, the range of the size of the primary seed for obtaining a seed agglomerated into a single crystal at lower temperature and within shorter treatment time should be desirably within the area A shown in FIG. 5, with the length of one side being 5 μm or less, preferably 0.5 μm to 2 μm, and the film thickness t being preferably 1 μ1 m or less, more preferably 700 A to 4000 A, optimally 1200 A to 2000 A.

As can be also seen from FIG. 5, if the film thickness of the primary seed exceeds 1,200 A, patterning dimensions can be made 1 μm or more for one side, and therefore conventional photolithographic technique level can sufficiently correspond thereto.

The shape of the primary seed is not limited at all to square shape as described above, but it may be any shape which can be agglomerated into a single body by heat treatment in an atmosphere containing hydrogen. For example, polygonal, ellipsoidal, circular shapes, etc. may be available.

The conditions at this time were primary seeds comprising poly-Si containing $1\times10^{20}$ atoms/cm$^3$ of P with a layer thickness of 4000 A and a diameter of 1.2 μmφ arranged on a Si wafer having a thermally oxidized silicon layer with a layer thickness of 2000 A as the substrate, a pressure of 760 Torr, and a heat treatment temperature of 1045° C.

As can be also clear from FIG. 7, by heat treatment in an atmosphere containing hydrogen as compared with the heat treatment in an atmosphere containing no hydrogen, a primary seed with a layer thickness as thick as 4000 A can be formed into a single crystal.

Figure 1C:
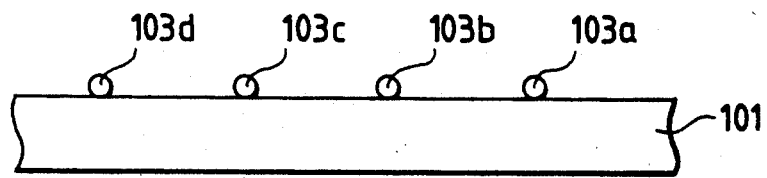

As shown above, primary seeds 102a–102d worked sufficiently finely so as to be agglomerated into single crystals (see FIG. 1B) are heat treated in an atmosphere containing hydrogen in the subsequent step. The primary seeds 102a–102d subjected to the heat treatment are agglomerated to be changed to single crystalline seeds 103a–103d as shown in FIG. 1C. As the heat treatment conditions at this time, use of an atmosphere containing hydrogen is desirable for agglomeration into a single crystal within shorter time and at lower temperature.

The hydrogen concentration in the above atmosphere containing hydrogen may be preferably 20% to 100%, more preferably 70% to 100%, optimally 90% to 100%.

The pressure when performing the heat treatment may be either reduced pressure, normal pressure, pressurization, but preferably reduced pressure in order to be agglomerated into a single body within shorter time and at lower temperature. FIG. 7 shows the relationship between the formation percentage of the single crystalline seeds and the heat treatment time.

The temperature for carrying out the heat treatment may be preferably lower than the temperature at which the primary seeds melt and not lower than the temperature at which the atoms of the material of the primary seeds begin to move in solid phase in order to reduce the surface energy.

When heat treatment is carried out at the temperature where primary seeds melt or higher, no single crystalline seed may sometimes not be obtained due to the reaction with the base material, evaporation, etc.

The temperature at which the atoms of the material of the above primary seed begin to move, which also depends on the surface area, and film thickness, is generally about $0.6\times Tm$ (K) (here, Tm is the melting point (K) of the material of primary seed).

When the material of the primary seed is made of silicon, single crystalline seeds can be formed by heat treatment at a heat treatment temperature of 800° C. to 1100° C.

The lower limit of the heat treatment time may be 10 seconds or longer, more preferably 30 seconds or longer, optimally 5 minutes or longer, and the upper limit may be 10 hours or shorter, more preferably 5 hours or shorter, optimally 30 minutes or shorter for forming single crystalline seeds agglomerated into single bodies with good yield.

If the heat treatment time is less than 10 seconds, at times no single crystalline seed may be sufficiently formed from non-single crystalline primary seeds.

If the heat treatment time is longer than 10 hours, depending on the material of primary seed, it may have high vapor pressure at the heat treatment temperature, or react with the material of the base material surface to form a compound with high vapor pressure, whereby the single crystalline seed may sometimes become smaller through sublimation reaction until it disappears.

When a compound with high vapor pressure is formed through the solid phase reaction between the primary seed material and the material of the base material surface by the heat treatment in an atmosphere containing hydrogen as described above, it is desirable to provide an intermediate layer comprising a material which undergoes substantially no reaction with the primary seed material between the primary seed and the base material, thereby preventing contact between the primary seed material and the base material.

As the material for the above intermediate layer, there may be employed a material chemically stable and having low nucleation density relative to the crystal material to be grown, such as $Al_2O_3$, $SiN_x$, $SiON$, etc.

As the layer thickness of the above intermediate layer, it may be a layer thickness which can prevent contact between the primary seed material and the base material. The thickness range between 50 A to 500 A can form a stable layer without variance in layer thickness.

The above intermediate layer can form seeds by utilizing the primary seed material efficiently even with a combination of the materials of the primary seed and the base material which cause the solid phase reaction as described above by the heat treatment in an atmosphere containing hydrogen, and also can prevent digging or surface roughening of the base material through the above solid phase reaction.

Figure 1D:
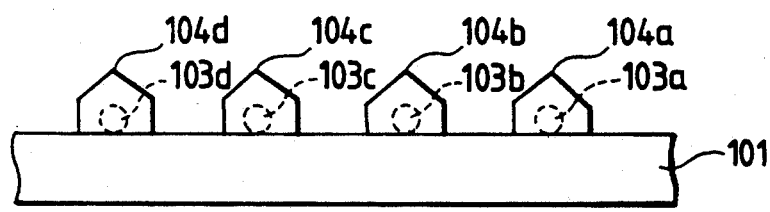
Figure 1E:
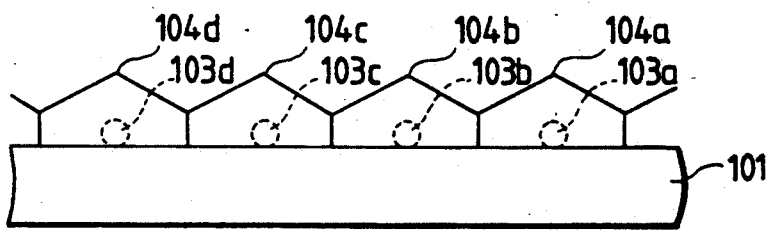

Next, the seeds 103a-103d are applied with crystal groth treatment (FIG. 1D). The single crystals 104a-104d may be either homoepitaxial or heteroepitaxil relative to the seeds 103a-103d, and the conditions capable of selective growth such as the gas phase method or the liquid phase method may be employed. The single crystals 104a-104d, when growth is continued, will collide mutually against adjacent single crystals to form a grain boundary there as shown in FIG. 1E. The position of the grain boundary is formed substantially at the middle position between the seeds as can be seen from FIG. 1E. Accordingly, by arranging the primary seed at a desired position, both the position of the grain boundary and the grain size of the single crystal grown can be controlled.

Figure 1F:
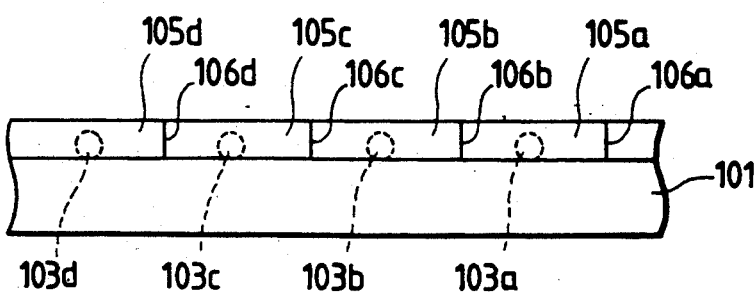

The single crystal grown as described above is flattened depending on its purpose such as formation of a device thereon, etc. by way of etching, lapping, etc. of the respective upper parts of the single crystals 104a-104d as shown in FIG. 1F.

The impurity doped in the present invention has the function of promoting agglomeration and the function of enlarging the scope of the conditions for occurrence of agglomeration.

According to the example as described above, in the case hen the primary seed forming material is a polycrystalline silicon, the impurity contained in the primary seed may be, for example, P (phosphorus), and by making its concentration, for example, about $1 \times 10^{20}$ $cm^{-3}$, a thin layer primary seed with one side of 2 $\mu m$ square and a thickness of 4,000 A is agglomerated into a single body by the heat treatment in an atmosphere containing hydrogen at 1,000° C. for 5 minutes.

Therefore, for agglomeration of a layer with a larger thickness, doping of an impurity is an extremely effective factor.

FIG. 8 shows the relationship between the layer thickness of the non-doped poly-Si continuous layer and the poly-Si continuous layer containing $7.5 \times 10^{20}$ atoms/cm³ of phosphorus and the agglomeration initiation temperature when heat treatment was carried out in an atmosphere of 100% hydrogen gas, under a pressure of 760 Torr for 30 minutes. As is apparent from FIG. 8, it can be understood that the poly-Si layer containing an impurity initiates agglomeration at a temperature lower by about 100° C. as compared with the poly-Si layer containing no impurity.

EXAMPLE 1

Referring to FIGS. 1A to 1F, Example 1 of the present invention is to be described.

First, by use of a 4 inch silicon wafer as the substrate 101, an amorphous silicon oxide film with a thickness of 2,000 A was formed according to conventional thermal oxidation method so as to make the surface a non-nucleation surface with small nucleation density. On the film, a polycrystalline silicon film 102 was formed to a thickness of 2,000 A according to the LPCVD method. The conditions used at this time were monosilane ($SiH_4$) as the source gas, a flow rate of 50 SCCM, a pressure of 0.3 Torr and a film formation temperature of 620° C. Subsequently, into the polycrystalline silicon film 102, $^{31}P+$ (phosphorus) was implanted as the impurity at $1 \times 10^{15} cm^{-2}$ by means of an ion implanter under the conditions of an ion acceleration voltage of 30 KeV (see FIG. 1A).

Next, the polycrystalline silicone film 102 doped with phosphorus at the above concentration was subjected to patterning into square shapes each of 1.2 $\mu m \times 1.2$ $\mu m$ at intervals of 100 $\mu m$ by use of conventional photolithographic technique, which were made the primary seeds 102a-102d (see FIG. 1B).

Next, the substrate 101 having the primary seeds 102a-102d thus formed thereon as heat treated at 1,010° C. in hydrogen atmosphere of a pressure of 760 Torr for 3 minutes. As the result, the respective primary seeds ere each agglomerated into a single body as shown in FIG. 1C to become single crystalline seeds 103a-103d.

Subsequently, crystal formation treatment was applied on the substrate having seeds 103a-103d thus formed thereon. The crystal formation treatment conditions at this time were made a gas system of $SiH_2Cl_2:HCl:H_2=0.53:1.65:100$ (SLM), as treatment temperature of 990° C. and a pressure of 150 Torr. As a result, within the initial several minutes, single crystals 104a-104d were grown with the seeds 103a-103d as the original points, as shown in FIG. 1D.

When growth was continued under the same conditions, the single crystals adjacent to each other were collided against each other in the form as shown in FIG. 1E to form a grain boundary at substantially the middle position between the adjacent seeds.

The group of single crystals formed as described above was flattened by lapping to form a group of single crystals with one side of about 100 $\mu m$ on the $SiO_2$ films. When crystal diffraction by X-ray was conducted for these groups of single crystals, extremely good crystallinity was observed.

EXAMPLE 2

A polycrystalline silicon film doped with P (phosphorus) at $3\times10^{15}\text{cm}^{-2}$ by LPCVD was deposited to a thickness of 250 A on a glass substrate. The deposited film was subjected to patterning into square shapes of 0.3 μm × 0.3 μm at intervals of 100 μm by use of the EB (electron beam) exposure technique to form primary seeds.

The glass substrate having the above primary seeds arranged thereon was heat treated at 990° C. in hydrogen atmosphere of a pressure of 200 Torr for 2 minutes to be converted into single crystalline seeds, followed by the crystal growth treatment under the conditions of $SiH_2Cl_2:HCl:H_2=0.53:1.65:100$ (SLM), 990° C., 150 Torr for 90 minutes. By this treatment, a group of single crystals with one side of about 100 μm having grain boundaries at substantially the middle position between the adjacent seeds were grown.

The upper surface of the single crystal grown was flattened by lapping, whereby a layer comprising a group of single crystals with one side of 100 μm square was formed on the glass substrate.

When crystallinity of the single crystal group was confirmed by X-ray, it was found to be extremely good.

EXAMPLE 3

On a glass substrate was deposited a polycrystalline germanium to 1,000 A, and As ions were implanted into the deposited film by an ion implanter at $1\times10^{15}/\text{cm}^2$, 50 KeV into the deposited film.

Next, the above germanium thin film doped with As was subjected to patterning by conventional photolithographic technique into square shapes of 1.2 μm × 1.2 μm at intervals of 100 μm to form primary seeds.

Next, the glass substrate having the above primary seeds arranged thereon was heat treated in hydrogen atmosphere of a pressure of 50 Torr at 700° C. for one minute to convert them into seeds of single crystalline germanium.

Then, under the same conditions as in the foregoing Example 2, silicon single crystals were grown heteroepitaxially, followed by application of flattening treatment, to form a group of Si single crystals with one side of 100 μm square.

The single crystals were confirmed to be of good quality by X-ray diffraction.

EXAMPLE 4

First, this Example is described by referring to FIGS. 9A to 9D.

Figure 9A:
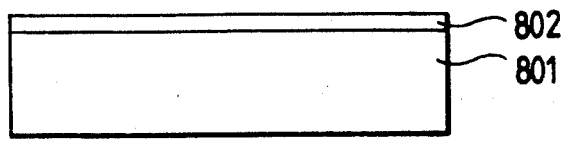
FIG. 9A to FIG. 9D are schematic illustrations for explanation of an example of the present invention.
Figure 9B:
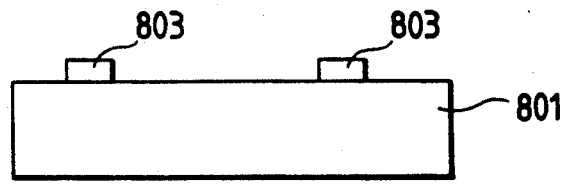
Figure 9C:
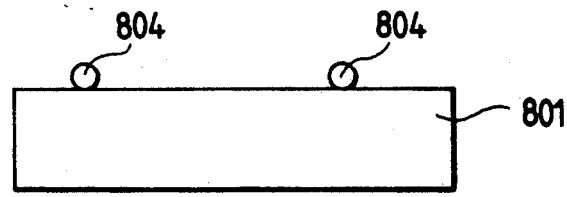

On a 4 inch molten quartz 801, a polycrystalline silicon film 802 was deposited to 1500 A by use of LPCVD (FIG. 9A). According to conventional photolithographic steps, the polycrystalline silicon film was subjected to patterning into lattice points shaped in circular islands of 1.2 μm in diameter at intervals of 50 μm to form primary seeds 803 (FIG. 9B). The substrate having the above primary seeds 803 arranged thereon was annealed in hydrogen atmosphere at 100 Torr, 1050° C., for 20 minutes. At this time, the primary seeds comprising a polycrystalline silicon film subjected to patterning are agglomerated to become respectively single crystalline seeds 804 of single domain (FIG. 9C).

Figure 10:
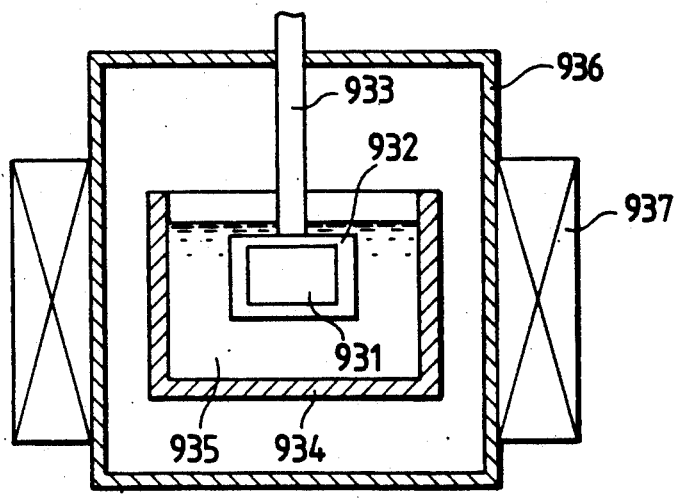
FIG. 10 is a schematic constitutional view showing an example of the crystal growth device.

FIG. 10 is a schematic constitutional view showing an example of the crystal growth device to be used in this Example of the selective growth method in liquid phase.

In FIG. 10, 931 is a substrate on the surface of which is effected selective deposition, said substrate being fixed and held by a substrate holder 932, and said substrate holder being suspended from above by a substrate supporting rod 933. 934 is a crucible, and in said crucible is housed a solution 935 containing the components of the crystal material to be grown. The above members are arranged within a treatment chamber 936 and a heater 937 is arranged around said treatment chamber.

During selective deposition, the substrate 931 is dipped into the above solution 935, and the treatment chamber 936 is internally heated to n appropriate temperature by the heater 937, and can be cooled gradually at an appropriate rate.

Next, on the substrate having seeds formed thereon, crystal growth treatment was applied according to the liquid phase method by use of a crystal growth device shown in FIG. 10.

The conditions used at this time involved a saturated solution at 1000° C. with silicon as the solute and tin as the solvent. The solution gradually cooled to 800° C. at a cooling rate of 0.2° C./min.

After completion of the crystal growth treatment, the substrate was taken out of the crystal growth device, and washed with dilute hydrochloric acid. As a result, the crystals 805 grown from the seeds were found to cover the substrate (FIG. 9D).

According to such selective deposition from liquid phase, since deposition can be effected under the conditions extremely approximate to thermal equilibrium under the state where the supersaturation of the deposited material is maintained sufficiently small, single crystals of good quality without crystal defects, etc. can be obtained.

Figure 9D:
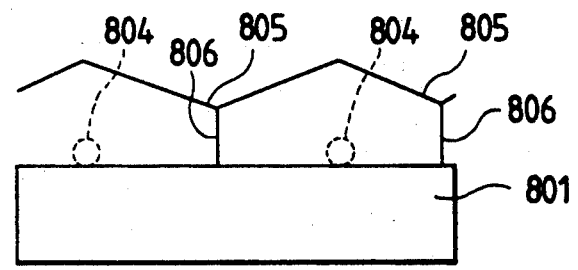

The grown crystal 805 contacts adjacent seeds substantially at the middle therebetween to form a grain boundary 806, and a crystal controlled in the position of the grain boundary and a grain size to 50 μm could be formed (FIG. 9D).

EXAMPLE 5

Figure 11A:
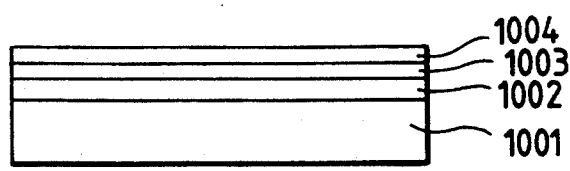
FIG. 11A to FIG. 11D, FIG. 12A to FIG. 12E, and FIG. 13A to FIG. 13E are schematic illustrations for explanation of examples of the present invention.
Figure 11B:
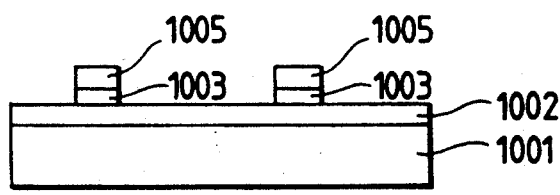
Figure 11C:
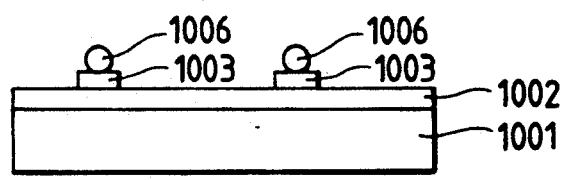

Example of the present invention is described by referring to FIGS. 11A to 11C.

A 4 inch silicon wafer 1001 was surface oxidized according to conventional thermal oxidation method similarly as in Example 1 to form an amorphous silicon oxide layer 1002 with a thickness of 2000 A.

On the silicon oxide layer was deposited a silicon nitride layer 1003 by the LPCVD method to a thickness of 500 A. The conditions at this time were $SiH_2Cl_2$ at a flow rate of 20 sccm and $NH_3$ at a flow rate of 80 sccm as the source gases, a pressure of 0.3 Torr and a film formation temperature of 800° C.

Subsequently, according to the LPCVD method, a polycrystalline silicon film 1004 doped with phosphorus was deposited to a thickness of 1000 A (FIG. 11A). The conditions used at this time were $SiH_4$ containing 0.3 of $PH_3$ at a flow rate of 50 sccm, a pressure of 0.3 Torr and a film formation temperature of 630° C.

Next, the polycrystalline silicon film doped with phosphorus and the silicon nitride film were together subjected to patterning by use of conventional reactive ion etching technique and formed into square shapes each of 0.8 μm × 0.8 μm at intervals of 100 μm to form a substrate having the primary seeds 1005 (FIG. 11B).

Next, the substrate having thus formed original grains thereon was heat treated in hydrogen atmosphere of 760 Torr, at 1000° C. for 30 minutes. As the result, as shown in FIG. 11C, the respective primary seeds 1005 ere each agglomerated into single crystals to become single crystalline seeds 1006. These seeds were confirmed to be single crystals by a transmission electron microscope.

Next, crystal growth treatment according to the CVD method was applied on the substrate having the seeds formed thereon. The conditions used at this time ere a gaseous system of $SiH_2Cl_2:HCl:H_2 = 1.2:1.8:100$ (SLM), a pressure of 150 Torr and a treatment temperature of 960° C.

Figure 11D:
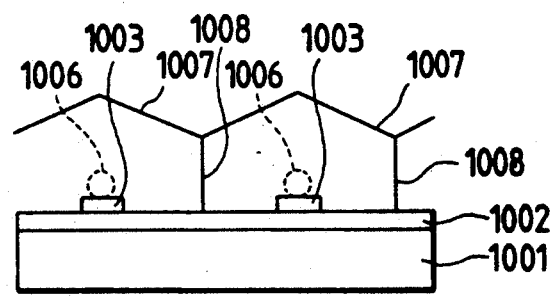

When growth was continued under these conditions, the single crystals grown from the seeds adjacent to each other contacted each other substantially at the middle between the adjacent seeds within about 90 minutes to form a grain boundary as shown in FIG. 11D.

When the outer shape of the crystal was observed by a scanning electron microscope, 99.9% of about 4400 samples were found to form facets inherent in single crystals.

EXAMPLE 6

Referring to FIGS. 12A to 12E, this Example is described.

First, on quartz 1201 (FIGS. 12A) as the base material, an amorphous $Si_3N_4$ layer 1202 was deposited to 500 Å as the intermediate layer by use of conventional LPCVD, and further a poly-Si layer 1203 to 1000 Å thereon by use of the same LPCVD to form a substrate.

Into the poly-Si layer 1203 of the substrate, $^{31}P^+$ ions were implanted by the ion implantation method at an acceleration energy of 40 KeV and an implantation amount of $8 \times 10^{15}$ cm$^{-2}$ to form a substrate having a poly-Si-layer 1204 (FIGS. 12B) doped with phosphorus.

Figure 12A:
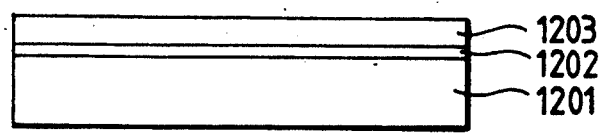
Figure 12B:
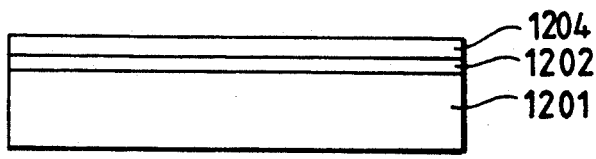
Figure 12C:
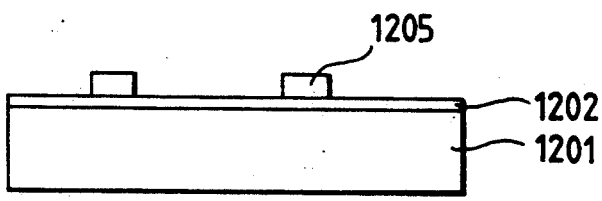

Next, the poly-Si layer 1203 was subjected to patterning in island shape of 1.2 $\mu m\phi$ in diameter and 50 $\mu m$ pitch to form a substrate having primary seeds 1205 (FIG. 12C).

The above substrate was annealed in hydrogen atmosphere at 1000° C. 760 Torr, for 5 minutes.

Figure 12D:
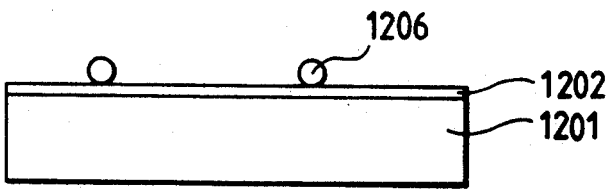
Figure 12E:
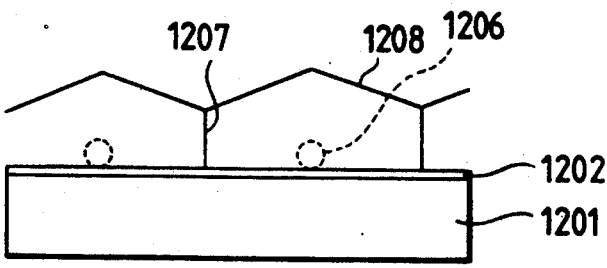

As a result, the above primary seeds 1205 were agglomerated into a single body to become single crystalline seeds 1206 (FIGS. 12D).

Subsequently, crystal growth treatment was applied on the above substrate similarly as in Example 1, and single crystals 1208 of good crystallinity having a grain size of about 50 $\mu m$ and a grain boundary 1207 (FIGS. 12E) at the position substantially at the middle mutually between the above single crystalline seeds were formed.

Figure 13A:
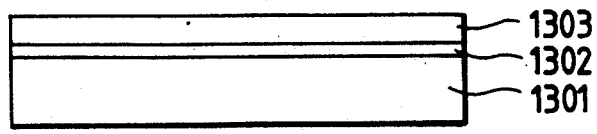
Figure 13B:
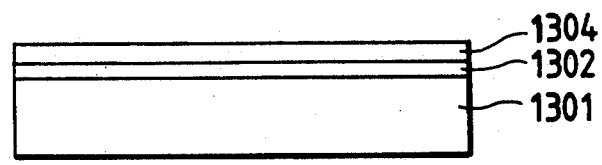

EXAMPLE 7 similarly as in Example 6, on a quartz substrate 1301, a-$Si_3N_4$ layer 1302 and a poly-Si layer 1303 were formed to form a substrate having a poly-Si layer 1304 subjected to ion implantation (FIG. 13A and FIG. 13B).

Next, the poly-Si layer 1304 and the a-$Si_3N_4$ layer 1302 were subjected together to etching with the pattern of the same dimensions as in Example 6 to form a substrate having an primary seeds 1305.

The substrate was subjected to heat treatment in hydrogen atmosphere under the heat treatment conditions of 950° C. and a pressure of 100 Torr.

Figure 13C:
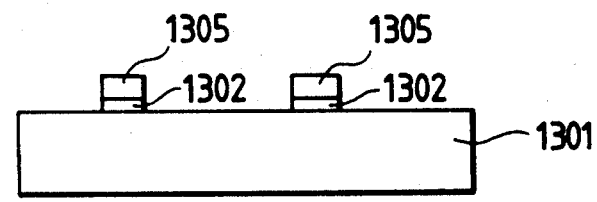
Figure 13D:
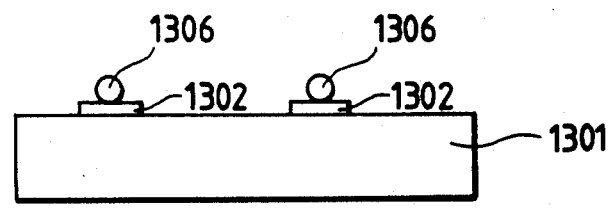

The primary seeds 1305 (FIGS. 13C) on the substrate were agglomerated to single bodies to become single crystalline seeds 1306 (FIGS. 13D).

Figure 13E:
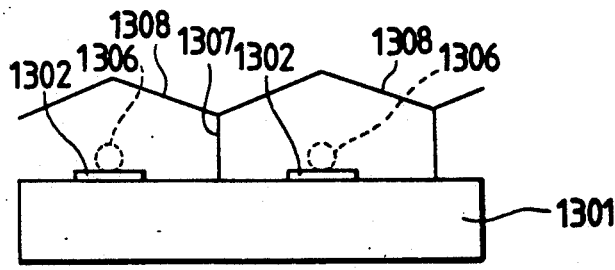

Then, crystal growth treatment as applied on the above substrate similarly as in Example 1, and single crystals 1308 (FIGS. 13E) of good crystallinity having a grain size of about 50 $\mu m$ and a grain boundary 1307 at the position substantially in the middle mutually between the above single crystalline seeds were formed.

I claim:

1. A method for forming a crystal comprising the steps of:
   (i) providing a substrate patterned to have thereon (a) at least one primary seed of non-single crystalline material doped with an impurity and (b) a non-nucleation surface having a smaller nucleation density than the primary seed, wherein said impurity is at least one selected from the group of P, B, As, and Sn; said at least one primary seed having a sufficiently fine surface for agglomeration into a single crystalline seed;
   (ii) heat treating said at least one primary seed doped with said impurity in an atmosphere containing hydrogen gas at a temperature lower than the melting point temperature of said at least one primary seed, thereby causing each said primary seed to agglomerate to form a single crystalline seed; and
   (iii) growing a crystal from each said single crystalline seed.

2. A method according to claim 1, wherein said primary seed comprises an amorphous material.

3. A method according to claim 1, wherein said primary seed comprises a polycrystalline material.

4. A method according to claim 1, wherein said atmosphere contains 20 vol. % to 100 vol. % of hydrogen gas.

5. A method according to claim 1, wherein said crystal growth treatment is a gas phase method.

6. A method according to claim 1, wherein said crystal growth treatment is a liquid phase method.

7. A method according to claim 1, wherein said non-nucleation surface is formed of a non-single crystalline material.

8. A method according to claim 1, wherein said non-nucleation surface is formed of an electrically insulating material.

9. A method according to claim 1, wherein said non-nucleation surface is formed of a material which can react with said primary seed in solid phase with difficulty.

10. A method according to claim 1, wherein the concentration of said impurity is at least $1 \times 10^{20}$ atoms/cm$^3$.

* * * * *

UNITED STATES PATENT AND TRADEMARK OFFICE
CERTIFICATE OF CORRECTION

PATENT NO. : 5,190,613
DATED : March 2, 1993
INVENTOR(S) : KENJI YAMAGATA

It is certified that error appears in the above-identified patent and that said Letters Patent is hereby corrected as shown below:

ON THE TITLE PAGE:
IN [56] REFERENCES CITED

Under U.S. PATENT DOCUMENTS:
"Schwatle et al." should read --Schwuttke et al.-- and "3,634,143 11/1972 Brenen" should read --3,634,143 1/1972 Brennan--.

Under OTHER PUBLICATIONS:
""Crystal Growth Process,"" should read --"Crystal Growth Processes",--; "Bishop Brigg, Glagon," should read --Bishopbriggs, Glasgow,--; ""Graphnepitaxy and Zone Melting"" should read --"Graphoexpitaxy and Zone-Melting"--; "Putunted" should read --Patterned--; and ""Low-Defect Density" should read --"Low-Defect-Density--.

IN [57] ABSTRACT

Line 3, "crystaline" should read --crystalline--.

COLUMN 2

Line 29, "A" should read --Å--.
Line 40, "Groth" should read --Growth--.
Line 52, "A" should read --Å--.

COLUMN 3

Line 2, "rain" should read --grain--.

UNITED STATES PATENT AND TRADEMARK OFFICE
CERTIFICATE OF CORRECTION

PATENT NO. : 5,190,613
DATED : March 2, 1993
INVENTOR(S) : KENJI YAMAGATA

Page 2 of 4

It is certified that error appears in the above-identified patent and that said Letters Patent is hereby corrected as shown below:

COLUMN 5

Line 25, "support" should read --suppose--.
    Line 40, "inn" should read --in--.
    Line 57, "(10,000 A." should read --(10,000 Å).--.
    Line 62, "length" should read --length 1--.
    Line 64, "1 µl m" should read --1 µm-- and "700 A to 4000 A" should read --700 Å to 4,000 Å,--.
    Line 65, "1200 A to 2000 A." should read --1,200 Å to 2,000 Å.--.
    Line 67, "1,200 A," should read --1,200 Å,--.

COLUMN 6

Line 11, "4000 A" should read --4,000 Å--.
    Line 13, "2000 A" should read --2,000 Å--.
    Line 20, "4000 A" should read --4,000 Å--.
    Line 35, "100%" should read --100%.--.
    Line 51, "not" should be deleted.

COLUMN 7

Line 28, "50 A to 500 A" should read --50 Å to 500 Å--.
    Line 40, "groth" should read --growth--.
    Line 42, "epitaxil" should read --expitaxial--.
    Line 64, "hen" should read --when--.

COLUMN 8

Line 1, "4,000 A" should read --4,000 Å--.
    Line 24, "2,000 A" should read --2,000 Å--.
    Line 28, "2,000 A" should read --2,000 Å--.

UNITED STATES PATENT AND TRADEMARK OFFICE
CERTIFICATE OF CORRECTION

PATENT NO. : 5,190,613
DATED : March 2, 1993
INVENTOR(S) : KENJI YAMAGATA

It is certified that error appears in the above-identified patent and that said Letters Patent is hereby corrected as shown below:

COLUMN 8

Line 44, "as" should read --was--.
Line 47, "ere" should read --were--.
Line 56, "the" (first occurrence) should read --the respective--.

COLUMN 9

Line 5, "250A" should read --250 Å--.
Line 29, "1,000 A," should read --1,000 Å--.
Line 53, "1500 A" should read --1,500 Å--.

COLUMN 10

Line 12, "n" should read --an--.
Line 47, "2000 A." should read --2,000 Å.--.
Line 50, "500 A." should read --500 Å.--.
Line 56, "1000 A" should read --1,000 Å--.
Line 57, "0.3" should read --0.3%--.

COLUMN 11

Line 1, "ere" should read --were--.
Line 8, "ere" should read --were--.
Line 27, "500 A" should read --500 Å--.
Line 28, "1000 A" should read --1,000 Å--.
Line 33, "8x1015 $cm^{-2}$" should read --8x$10^{15}cm^{-2}$--.
Line 54, "similarly" should read --Similarly--.

UNITED STATES PATENT AND TRADEMARK OFFICE
CERTIFICATE OF CORRECTION

PATENT NO. : 5,190,613

DATED : March 2, 1993

INVENTOR(S) : KENJI YAMAGATA

It is certified that error appears in the above-identified patent and that said Letters Patent is hereby corrected as shown below:

COLUMN 12

Line 2, "an" should be deleted.
   Line 9, "as" should read --was--.
   Line 42, "crys-" should read --growing--.
   Line 43, "tal growth" should be deleted.

Signed and Sealed this

Twenty-ninth Day of March, 1994

Attest:

BRUCE LEHMAN

Attesting Officer    Commissioner of Patents and Trademarks